(12) United States Patent
Yoshino et al.

(10) Patent No.: US 10,600,754 B2
(45) Date of Patent: Mar. 24, 2020

(54) BONDING METHOD

(71) Applicant: KAIJO CORPORATION, Tokyo (JP)

(72) Inventors: Hideki Yoshino, Tokyo (JP); Masaaki Miura, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 0 days.

(21) Appl. No.: 16/098,231

(22) PCT Filed: Feb. 28, 2017

(86) PCT No.: PCT/JP2017/007852
§ 371 (c)(1),
(2) Date: Nov. 1, 2018

(87) PCT Pub. No.: WO2018/029881
PCT Pub. Date: Feb. 15, 2018

(65) Prior Publication Data
US 2019/0164928 A1     May 30, 2019

(30) Foreign Application Priority Data

Aug. 10, 2016   (JP) ................................ 2016-157942

(51) Int. Cl.
*H01L 23/00* (2006.01)
*H01L 21/68* (2006.01)
(Continued)

(52) U.S. Cl.
CPC ........ *H01L 24/75* (2013.01); *H01L 21/67778* (2013.01); *H01L 21/68* (2013.01);
(Continued)

(58) Field of Classification Search
None
See application file for complete search history.

(56) References Cited

U.S. PATENT DOCUMENTS 5,242,103 A * 9/1993 Denvir ............. H01L 21/67138
                                              228/179.1
5,566,876 A * 10/1996 Nishimaki ............. H01L 24/78
                                              228/102
(Continued)

FOREIGN PATENT DOCUMENTS

JP    58-87842     5/1983
JP    9-289241    11/1997
(Continued)

OTHER PUBLICATIONS

International Search Report dated May 30, 2017 in International (PCT) Application No. PCT/JP2017/007852.

*Primary Examiner* — Andres Munoz
(74) *Attorney, Agent, or Firm* — Wenderoth, Lind & Ponack, L.L.P.

(57) ABSTRACT

There is provided a bonding method capable of accurately positioning a bonding stage. According to an aspect of the present invention, a bonding method using a bonding apparatus including a rotation drive mechanism for rotating a bonding stage 1 about a θ-axis includes the steps of: (e) locking the bonding stage with respect to the θ-axis, and bonding a wire or bump onto a certain area of a substrate held on the bonding stage; (f) unlocking the bonding stage with respect to the θ-axis, and rotating the bonding stage about the θ-axis with the rotation drive mechanism; and (g) locking the bonding stage with respect to the θ-axis, and bonding a wire or bump onto a remaining region of the substrate.

6 Claims, 12 Drawing Sheets

(51) Int. Cl.
*H01L 21/677* (2006.01)
*H01L 21/66* (2006.01)

(52) U.S. Cl.
CPC .............. *H01L 22/12* (2013.01); *H01L 24/11* (2013.01); *H01L 24/43* (2013.01); *H01L 24/741* (2013.01); *H01L 24/78* (2013.01); *H01L 24/742* (2013.01); *H01L 24/745* (2013.01); *H01L 2224/11002* (2013.01); *H01L 2224/43001* (2013.01); *H01L 2224/75251* (2013.01); *H01L 2224/75753* (2013.01); *H01L 2224/75803* (2013.01); *H01L 2224/78251* (2013.01); *H01L 2224/78753* (2013.01); *H01L 2224/78803* (2013.01)

(56) References Cited

U.S. PATENT DOCUMENTS

| | | | |
|---|---|---|---|
| 5,848,868 | A | 12/1998 | Suzuki |
| 2005/0184600 | A1* | 8/2005 | Haraguchi .............. H01L 24/78 310/12.24 |
| 2009/0269887 | A1 | 10/2009 | Hwang |
| 2009/0269889 | A1 | 10/2009 | Hwang |

FOREIGN PATENT DOCUMENTS

| | | |
|---|---|---|
| JP | 10-303241 | 11/1998 |
| JP | 2008-140983 | 6/2008 |
| JP | 2009-267413 | 11/2009 |
| JP | 2009-267414 | 11/2009 |
| JP | 4376889 | 12/2009 |

* cited by examiner

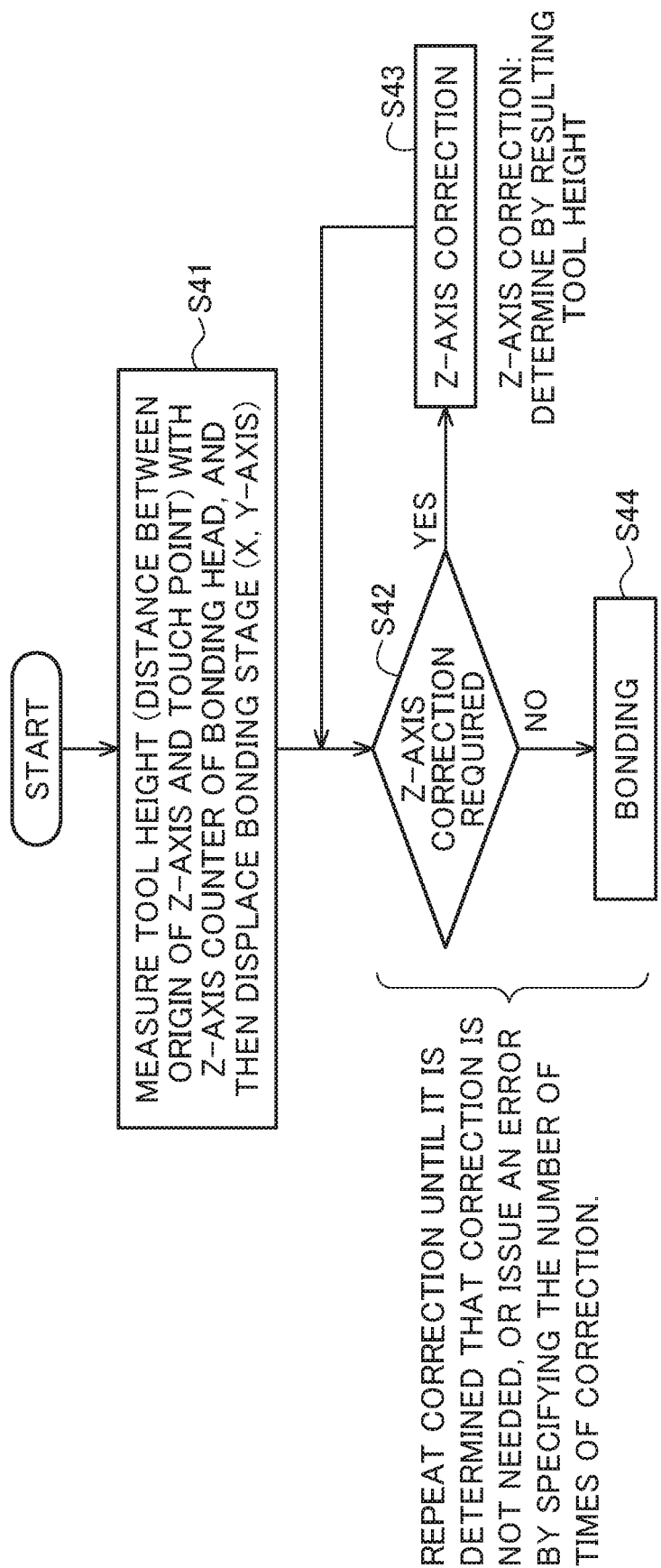

BONDING METHOD

TECHNICAL FIELD

The present invention relates to bonding methods.

BACKGROUND ART

Patent Literature 1 discloses that a wire bonding apparatus provided with an inversion unit enables to perform bonding onto a substrate having an area wider than the bonding area of the wire bonding apparatus. Specifically, when an XY coordinate system is set at the center of the substrate, bonding is performed while sliding the substrate in the X direction in the first quadrant and second quadrant on the far side, and then bonding is performed while sliding the substrate in the X direction in the third quadrant and fourth quadrant which have come to the far side after inverting the substrate. This enables to perform bonding onto a substrate having an area wider than the bonding area of the wire bonding apparatus.

In the above-described wire bonding apparatus, when a substrate is detached from the bonding stage and displaced to the inversion unit for inversion, the temperature of the substrate will decrease during this displacement period, and therefore re-preheating is needed for bonding in the third quadrant and the fourth quadrant after inversion. As the result, the productivity may decrease and a risk of cracking in the substrate will also increase.

Moreover, in the above-described wire bonding apparatus, when a substrate is exchanged by another substrate having a different thickness and bonding is attempted to be performed onto the latter, an operator always adjusts the apparatus so as to match the height of the substrate, and therefore it takes time to exchange product types and so on.

Patent Literature 2 discloses that a wire bonding apparatus provide with a rotation drive mechanism for rotating a bonding stage enables to perform bonding onto a substrate having an area wider than the bonding area of the wire bonding apparatus. Specifically, when an XY coordinate system is set at the center of the substrate, bonding is performed in the first quadrant and the second quadrant on the far side while expanding a movable range with an XY table having a bonding head mounted thereon, and then bonding is performed in the third quadrant and the fourth quadrant which have come to the far side after rotation by 180°. This enables to perform bonding onto a substrate having an area wider than the bonding area of a wire bonding apparatus.

In the above-described wire bonding apparatus, because the weight of the bonding stage itself is heavy, if this heavy bonding stage is rotated by the rotation drive mechanism, the stiffness of the bonding stage will decrease, and accordingly it is difficult to reliably stop the bonding stage. Moreover, vibration is likely to occur in the bonding stage during the bonding process. Thus, in the above-described wire bonding apparatus, it is difficult to accurately position the bonding stage, and accordingly an increase in the bonding speed is difficult to achieve and fine-pitch bonding also is difficult.

Patent Literature 3 discloses that a brake unit with an electromagnet is provided at the rotary shaft of a wire bonding apparatus. Here, once a column is stopped at a predetermined rotation position, then a control circuit energizes the electromagnet so as to be attracted to a disk, thereby fixing the rotary shaft.

In the above-described wire bonding apparatus, because a magnetic force by the electromagnet is used, this magnetic force may adversely affect a semiconductor element and the like inside an object to be bonded.

CITATION LIST

Patent Literature

Patent Literature 1: Japanese Patent No. 4376889
Patent Literature 2: Japanese Patent Application Laid-Open No. 10-303241
Patent Literature 3: Japanese Patent Application Laid-Open No. 58-87842

SUMMARY OF INVENTION

Technical Problem

The subject of an aspect of the present invention is to provide a bonding method capable of accurately positioning a bonding stage.

Solution to Problem

In the following, various aspects of the present invention will be described.

[1] A bonding method using a bonding apparatus including a rotation drive mechanism for rotating a bonding stage about a θ-axis includes the steps of: (e) locking the bonding stage with respect to the θ-axis, and bonding a wire or bump onto a certain area of a substrate held on the bonding stage; (f) unlocking the bonding stage with respect to the θ-axis, and rotating the bonding stage about the θ-axis with the rotation drive mechanism; and (g) locking the bonding stage with respect to the θ-axis, and bonding a wire or bump onto a remaining region of the substrate.

[2] In the above-described bonding method according to [1], the substrate is a wafer mounted on a carrier tape, the carrier tape includes a rotation stopper for positioning the wafer with an orientation flat or a notch, and the bonding apparatus includes an X-axis driving mechanism for displacing the bonding stage along an X-axis guide. The above-described method [2] includes the steps of: prior to the step (e), (a) storing the carrier tape into a storage section; (b) connecting the carrier tape to the X-axis driving mechanism, and conveying the carrier tape to a buffer area with the X-axis driving mechanism; (c) displacing the bonding stage to the buffer area with the X-axis driving mechanism and holding the carrier tape on the bonding stage; and (d) displacing the bonding stage to a bonding area with the X-axis driving mechanism. Here, the step (e) is a step of locking the bonding stage with respect to the θ-axis and the X-axis and bonding a wire or bump onto a certain area of the wafer of the carrier tape held on the bonding stage, and the step (g) is a step of locking the bonding stage with respect to the θ-axis and the X-axis and bonding a wire or bump onto a remaining region of the wafer.

[3] In the above-described bonding method according to [2], the bonding apparatus includes a Z-axis driving mechanism for displacing the bonding stage along a Z-axis guide, the step (c) is a step of detaching the carrier tape from the X-axis driving mechanism by displacing the bonding stage downward with the Z-axis driving mechanism, displacing the bonding stage to the buffer area with the X-axis driving mechanism, and holding the carrier tape on the bonding stage.

[4] In the above-described bonding method according to [2] or [3], the bonding apparatus includes a heater for heating the bonding stage, and the step (c) is a step of displacing the bonding stage to the buffer area with the X-axis driving mechanism, preheating the wafer, and holding the carrier tape on the bonding stage.

[5] In the above-described bonding method according to any one of [2] to [4], the bonding apparatus includes a recognition device configured to recognize a position of the wafer held on the bonding stage, and the step (d) is a step of displacing the bonding stage to a bonding area with the X-axis driving mechanism, and, correcting, if a position of the θ-axis of the wafer needs to be corrected as a result of recognizing the position of the wafer with the recognition device, the position of the θ-axis of the wafer with the rotation drive mechanism.

[5-1] In the above-described bonding method according to any one of [2] to [5], the step (f) is a step of unlocking the bonding stage with respect to the θ-axis, and rotating the bonding stage about the θ-axis with the rotation drive mechanism, and correcting, if a position of the θ-axis of the wafer needs to be corrected as a result of recognizing the position of the wafer with the recognition device, the position of the θ-axis of the wafer with the rotation drive mechanism.

[6] In the above-described bonding method according to any one of [2] to [5], and [5-1], the bonding apparatus includes a measurement device configured to measure a height of the wafer held on the bonding stage, and the step (d) is a step of displacing the bonding stage to a bonding area with the X-axis driving mechanism, and as a result of measuring the height of the wafer with the measurement device, correcting, if the height of the wafer needs to be corrected, the height of the wafer with the Z-axis driving mechanism.

[7] A bonding apparatus configured to bond a wire or bump onto a substrate includes: a bonding stage to hold the substrate; a θ-axis guide attached to the bonding stage; a rotation drive mechanism for rotating the θ-axis guide about a θ-axis; and a first lock section configured to be pressed against the θ-axis guide by the pressure of air in order to fix the bonding stage.

[8] The above-described bonding apparatus according to [7] further includes: an X-axis driving mechanism for displacing the bonding stage along the X-axis guide, the X-axis driving mechanism being attached to the bonding stage; and a second lock section configured to be pressed against the X-axis guide by the pressure of air in order to fix the bonding stage.

[9] The above-described bonding apparatus according to [8] further includes: a Y-axis driving mechanism for displacing the bonding stage along a Y-axis guide, the Y-axis driving mechanism being attached to the bonding stage; and a third lock section configured to be pressed against the Y-axis guide by the pressure of air in order to fix the bonding stage.

[10] The above-described bonding apparatus according to [8] or [9] further includes: a Z-axis driving mechanism for displacing the bonding stage along a Z-axis guide, the Z-axis driving mechanism being attached to the bonding stage; and a fourth lock section configured to be pressed against the Z-axis guide by the pressure of air in order to fix the bonding stage.

[11] The above-described bonding apparatus according to any one of [8] to [10] further includes: a storage section configured to store the substrate; a bonding area; a buffer area located between the bonding area and the storage section; and a unit configured to connect the substrate to the X-axis driving mechanism, and the X-axis driving mechanism is for displacing the bonding stage between the bonding area and the buffer area along the X-axis guide.

[12] In the above-described bonding apparatus according to [11], the substrate is a carrier tape having a wafer mounted thereon, and the carrier tape includes a rotation stopper for positioning the wafer with an orientation flat or notch.

[13] The above-described bonding apparatus according to any one of [8] to [12] further includes a heater for heating the substrate held on the bonding stage.

[14] The above-described bonding apparatus according to [10] further includes: a measurement device configured to measure a height of the substrate held on the bonding stage; and a control section configured to control, if the height of the substrate needs to be corrected as a result of measuring the height of the substrate with the measurement device, the Z-axis driving mechanism so as to correct the height of the substrate.

[15] The above-described bonding apparatus according to any one of [7] to [14] further includes: a recognition device configured to recognize a position of the substrate held on the bonding stage; and a control section configured to control, if a position of a θ-axis of the substrate needs to be corrected as a result of recognizing the position of the substrate with the recognition device, the rotation drive mechanism so as to correct the position of the θ-axis of the substrate.

[16] A carrier tape used in bonding a wire or bump onto a wafer, and the carrier tape for Wafer including a rotation stopper for positioning the wafer with an orientation flat or a notch.

Advantageous Effects of Invention

According to an aspect of the present invention, a bonding method capable of accurately positioning a bonding stage can be provided.

BRIEF DESCRIPTION OF DRAWINGS

FIG. 9 is a flow chart illustrating the details of a method for measuring the height of a wafer performed in a step illustrated in FIG. 10E and in a step illustrated in FIG. 11C.

DESCRIPTION OF EMBODIMENTS

Hereinafter, embodiments of the present invention will be described using the accompanying drawings. However, those skilled in the art would readily understand that the present invention is not limited to the following description and that the form and detail of the present invention can be variously varied without departing from the spirit and scope of the present invention. Accordingly, the present invention shall not be construed as being limited to the described contents of the embodiments set forth hereinafter.

Figure 1:
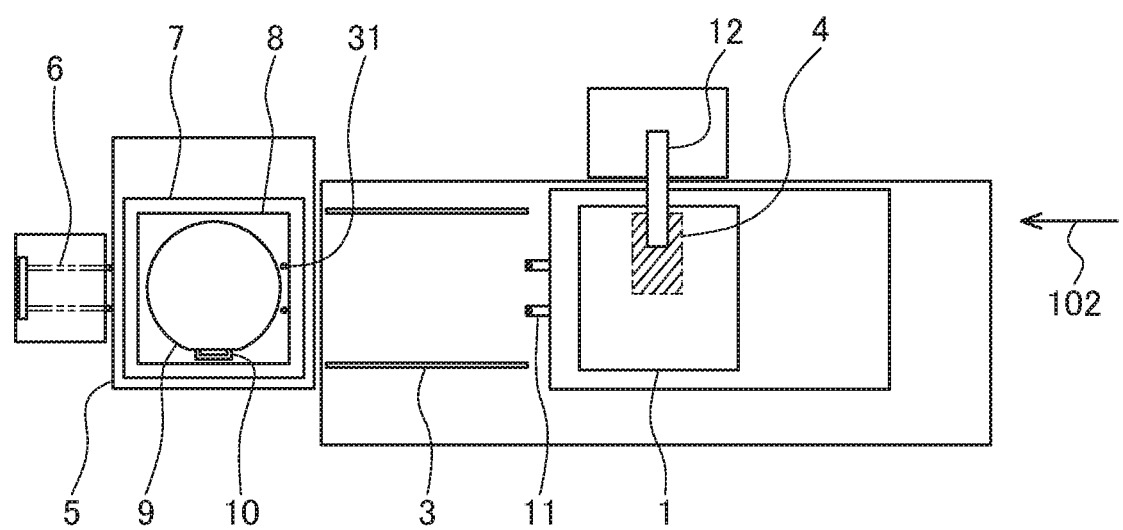
FIG. 1 is a plan view schematically illustrating a bonding apparatus according to an aspect of the present invention.

FIG. 1 is a plan view schematically illustrating a bonding apparatus according to an aspect of the present invention. This bonding apparatus is for bonding a wire or bump onto a substrate. The substrate is a carrier tape (referred to also as a carrier boat or a carrier) 8 having a wafer 9 mounted thereon. Moreover, the bonding apparatus includes a magazine (referred to also as a wafer cassette or a storage section) 7 for storing the carrier tape 8, an elevator (vertically driving mechanism) S for vertically displacing this magazine 7, and a pusher 6 for pushing out the carrier tape 8 stored in the magazine. A buffer area is provided next to the magazine 7, and a buffer unit 3 is arranged in this buffer area. A bonding area 4 is arranged next to the buffer area, and a bonding head 12 for performing bonding in the bonding area 4 is arranged in a vicinity of the bonding area 4. Moreover, this bonding apparatus includes a bonding stage 1 that can be displaced between the bonding area 4 and the buffer area.

Figure 2:
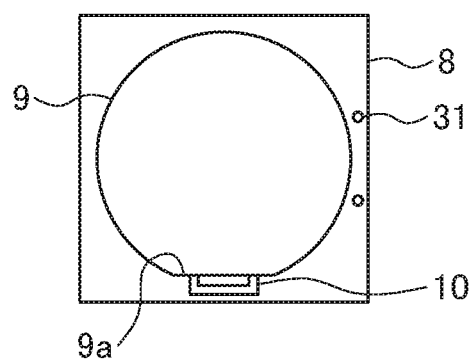
FIG. 2 is a plan view illustrating a carrier tape having a wafer mounted thereon.

FIG. 2 is a plan view illustrating a carrier tape having a wafer mounted thereon. As illustrated in FIG. 2 and FIG. 1, a dent or hole for mounting the wafer 9 is provided in the carrier tape 8, and the dent or hole has the wafer 9 mounted therein. A rotation stopper 10 is provided in the carrier tape 8, and this rotation stopper 10 is adapted to stop the rotation of the wafer 9 by contacting to an orientation flat 9a of the wafer 9. Because the wafer 9 is mounted to the carrier tape 8 while being positioned in this manner, the positioning of the wafer 9 becomes easy during bonding as compared with a case where the carrier tape 8 is not used.

Moreover, a dent or a hole (not illustrated) for mounting a wafer is provided in the carrier tape 8. Therefore, it is possible to mount a wafer to the carrier tape 8. Accordingly, it is possible to position a wafer with the orientation flat and to mount the same to the carrier tape 8. That is, a wafer can be easily positioned.

Because wafers having different sizes can be mounted to the carrier tape 8 of one size as described above, wafers having different sizes can be stored in the magazine. Accordingly, various types of the wafers can be handled.

Note that, in this embodiment, the rotation stopper 10 corresponding to the orientation flat of a wafer is provided in the carrier tape 8, but the rotation stopper corresponding to a notch of a wafer may be provided in the carrier tape. In that case, the rotation stopper is preferably adapted to stop the rotation of a wafer by contacting the notch of the wafer.

Moreover, in this embodiment, the carrier tape having a wafer mounted thereon is used as a substrate, but not limited thereto, and it is also possible to use a substrates other than the carrier tape having a wafer mounted thereon, and it is also possible to use, for example, a carrier tape having any of a frame, sample, or bonding work mounted thereon, as a substrate, and the substrate itself (for example, a wafer, a frame, a sample, a bonding work) may be used as a substrate without using the carrier tape.

According to this embodiment, the rotation stopper 10 can be provided at the position of the orientation flat 9a or notch of the wafer 9 in order to mount the wafer 9 to the carrier tape 8. Therefore, the wafer 9 can be mounted to the carrier tape 8 in a state where it is positioned, so a unit configured to detect an orientation flat or the like and to correct the orientation of the wafer 9 becomes unnecessary, and the productivity can also be increased.

Figure 3:
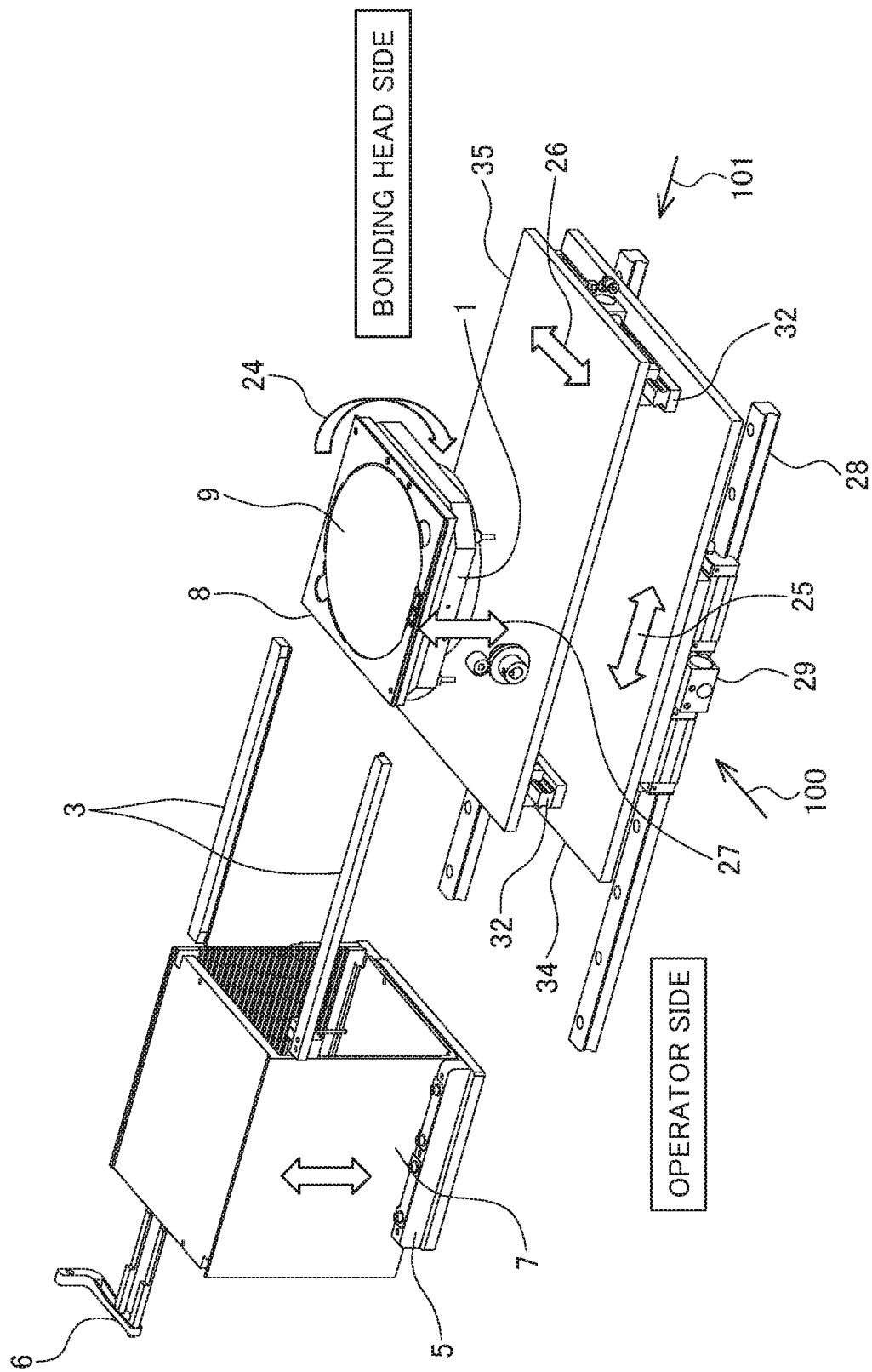
FIG. 3 is a perspective view illustrating a storage section, a buffer area, a bonding stage, a rotation drive mechanism, an X-axis driving mechanism, a Y-axis driving mechanism, and a Z-axis driving mechanism of the bonding apparatus illustrated in FIG. 1.
Figure 4A:
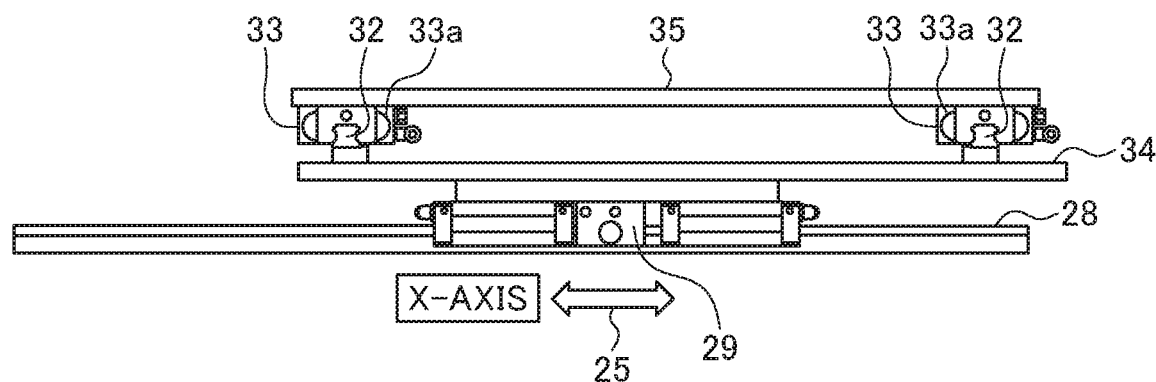
FIG. 4A illustrates the X-axis driving mechanism and Y-axis driving mechanism seen in a direction of an arrow 100 illustrated in FIG. 3.
Figure 4B:
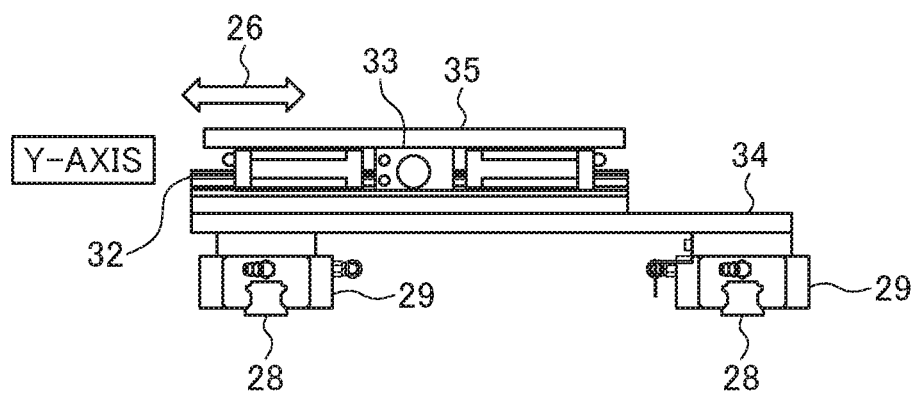
FIG. 4B illustrates the X-axis driving mechanism and the Y-axis driving mechanism seen in a direction of an arrow 101 illustrated in FIG. 3.
Figure 4C:
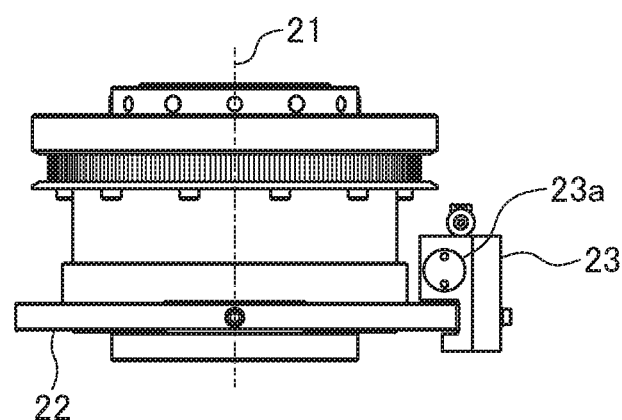
FIG. 4C illustrates the rotation drive mechanism seen in a direction of an arrow 100 illustrated in FIG. 3.
Figure 5A:
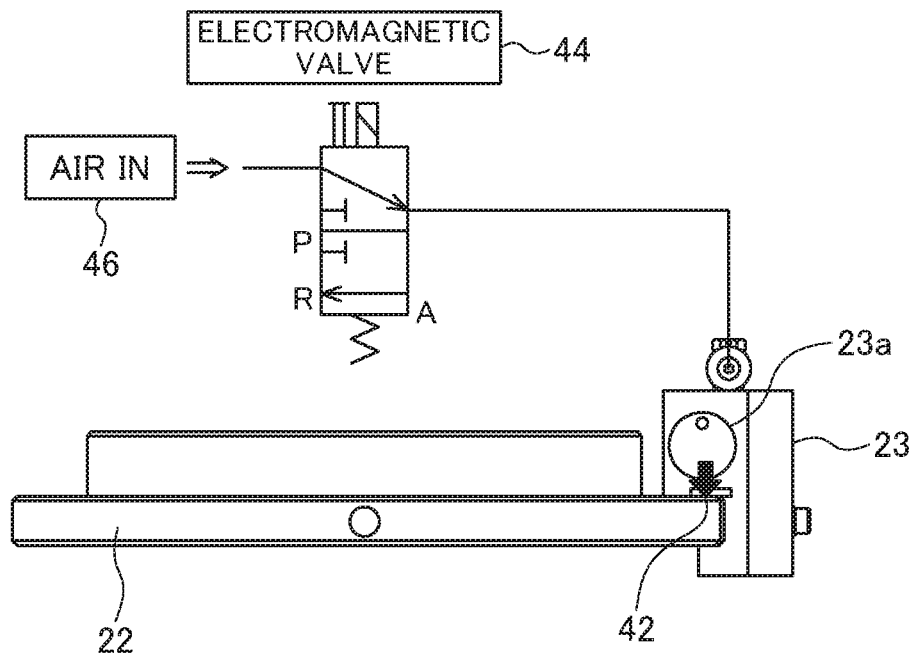
FIG. 5A is a schematic view illustrating a mechanism for locking a θ-axis guide.
Figure 5B:
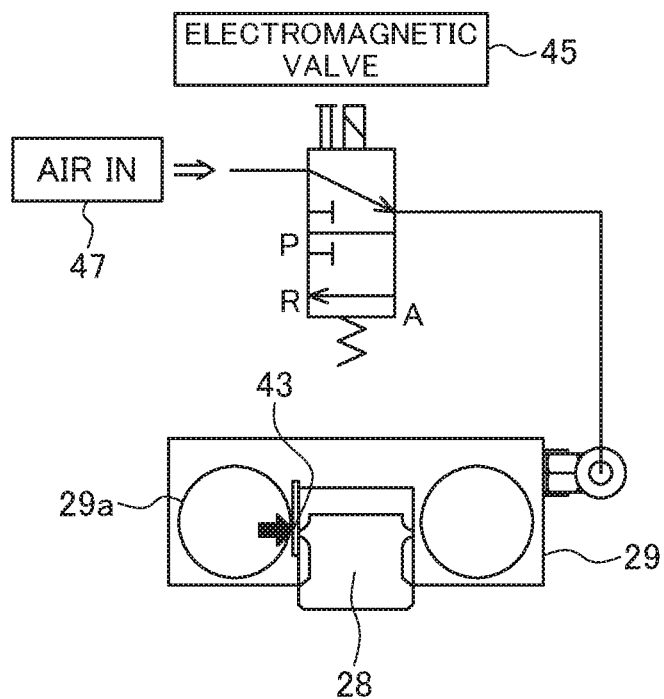
FIG. 5B is a schematic view illustrating a mechanism for locking an X-axis guide

FIG. 3 is a perspective view illustrating a storage section, a buffer area, a bonding stage, a rotation drive mechanism, an X-axis driving mechanism, a Y-axis driving mechanism, and a Z-axis driving mechanism of the bonding apparatus illustrated in FIG. 1. FIG. 4A illustrates the X-axis driving mechanism and the Y-axis driving mechanism seen in a direction of an arrow 100 illustrated in FIG. 3, FIG. 4B illustrates the X-axis driving mechanism and the Y-axis driving mechanism seen in a direction of an arrow 101 illustrated in FIG. 3, and FIG. 4C illustrates the rotation drive mechanism seen in a direction of an arrow 100 illustrated in FIG. 3. FIG. 5A is a schematic view illustrating a mechanism for locking a θ-axis guide, and FIG. 5B is a schematic view illustrating a mechanism for locking an X-axis guide As illustrated in FIG. 3, the vertical movement of the magazine 7 is enabled by an elevator 5. The magazine 7 has the carrier tape 8 stored therein, and the carrier tape 8 inside the magazine 7 can be pushed out to the buffer unit 3 in the buffer area with the pusher (horizontally driving mechanism) 6.

The bonding stage 1 is adapted to be able to hold the carrier tape 8 having the wafer 9 mounted thereon by vacuum suction. A rotation drive mechanism and a Z-axis driving mechanism illustrated in FIG. 4C are attached to the bonding stage 1. This rotation drive mechanism is for rotating the bonding stage 1 about a θ-axis (θ rotation-axis) 21 as indicated by an arrow 24 illustrated in FIG. 3. A θ-axis guide 22 is attached to the bonding stage 1, so that the θ-axis guide 22 is adapted to be rotated about the θ-axis 21 by the rotation drive mechanism. Moreover, this Z-axis driving mechanism is for displacing, along the Z-axis guide (not illustrated), the bonding stage 1 in the direction of an arrow 27 illustrated in FIG. 3. A non-illustrated Z-axis guide lock section configured to lock the Z-axis guide is provided in the Z-axis guide. This Z-axis guide lock section will be described later.

A θ-axis guide lock section 23 configured to lock the θ-axis guide 22 is provided in the θ-axis guide 22, and the θ-axis guide lock section 23 includes a first lock section 23a which is to be pressed against the θ-axis guide 22 by the pressure of air. Specifically, as illustrated in FIG. 5A, air 46 is adapted to be supplied to the θ-axis guide lock section 23 to press the first lock section 23a against the θ-axis guide 22 as indicated by an arrow 42 by the pressure of air and to sandwich and to lock the θ-axis guide 22 so as to fix the θ-axis guide 22 to the θ-axis guide lock section 23 and to fix the bonding stage 1. On/off of the supply of air is controlled by an electromagnetic valve 44.

Because the rotation drive mechanism is configured to cause the bonding stage 1 to freely rotate about the θ-axis as indicated by an arrow 24, it is possible to stop the bonding stage 1 on the θ-axis 21 with this rotation drive mechanism. However, just this rotation drive mechanism is not sufficient to stop the bonding stage 1 in the rotation direction. Then, the θ-axis guide lock section 23 is provided, so that the bonding stage 1 can be reliably stopped even if the weight of the bonding stage 1 itself is heavy, and generation of vibration in the bonding stage 1 during the bonding process can be also suppressed. As the result, the bonding stage 1 can be accurately positioned.

Moreover, the X-axis driving mechanism and Y-axis driving mechanism illustrated in FIGS. 4A and 4B are attached to the bonding stage 1. This X-axis driving mechanism is for displacing the bonding stage 1 in the direction of the arrow 25 along the X-axis guide 28. This Y-axis driving mechanism is for displacing the bonding stage 1 in the direction of the arrow 26 along the Y-axis guide 32. Note that the X-axis driving mechanism is capable of displacing the bonding stage 1 between the bonding area 4 and the buffer area along the X-axis guide 28.

Specifically, as illustrated in FIG. 3 and FIGS. 4A and 4B, an X table 34 can be displaced in the direction of the arrow 25 with the X-axis driving mechanism along the X-axis guide 28. The Y-axis guide 32 is attached to this X table 34, and Y table 35 can be displaced in the direction of the arrow 26 with the Y-axis driving mechanism along the Y-axis guide 32.

An X-axis guide lock section 29 configured to lock the X-axis guide 28 is provided in the X-axis guide 28, and as illustrated in FIG. 5B, the X-axis guide lock section 29 includes a second lock section 29a which is to be pressed against the X-axis guide 28 by the pressure of air 47. Specifically, the air 47 is adapted to be supplied to the X-axis guide lock section 29 to press the second lock section 29a against the X-axis guide 28 as indicated by the arrow 43 by the pressure of air and to sandwich and to lock the X-axis guide 28 so as to fix the X-axis guide lock section 29 to the X-axis guide 28 and to fix the X table 34. This enables to fix the displacement of the bonding stage 1 in the direction of the arrow 25. On/off of the supply of air is controlled by an electromagnetic valve 45.

Because the X-axis driving mechanism is configured so as to freely displace the bonding stage 1 in the direction of the arrow 25 together with the X table 34 along the X-axis guide 28, the bonding stage 1 together with the X table 34 can be stopped on the X-axis guide 28 by this X-axis driving mechanism. However, just this X-axis driving mechanism is not sufficient to stop the bonding stage 1 in the X-axis direction. Then, the X-axis guide lock section 29 is provided, so that the bonding stage 1 can be reliably stopped even if the weight of the bonding stage 1 itself is heavy, and generation of vibration in the bonding stage 1 during the bonding process can be also suppressed. As the result, the bonding stage 1 can be accurately positioned.

A Y-axis guide lock section 33 configured to lock the Y-axis guide 32 is provided in the Y-axis guide 32, and the Y-axis guide lock section 33 includes a third lock section 33a which is to be pressed against the Y-axis guide 32 by the pressure of air. Specifically, air is adapted to be supplied to the Y-axis guide lock section 33 to press the third lock section 33a against the Y-axis guide 32 by the pressure of air and to sandwich and to lock the Y-axis guide 32 so as to fix the Y-axis guide lock section 33 to the Y-axis guide 32, and to fix the Y table 35. This enables to fix the displacement of the bonding stage 1 in the direction of the arrow 26. On/off of the supply of air is controlled by an electromagnetic valve (not illustrated).

Because the Y-axis driving mechanism is configured so as to freely displace the bonding stage 1 in the direction of the arrow 26 together with the Y table 35 along the Y-axis guide 32, the bonding stage 1 together with the Y table 35 can be stopped on the Y-axis guide 32 by this Y-axis driving mechanism. However, just this Y-axis driving mechanism is not sufficient to stop the bonding stage 1 in the Y-axis direction. Then, the Y-axis guide lock section 33 is provided, so that the bonding stage 1 can be reliably stopped even if the weight of the bonding stage 1 itself is heavy, and generation of vibration in the bonding stage 1 during the bonding process can be also suppressed. As the result, the bonding stage 1 can be accurately positioned.

The Z-axis guide lock section includes a fourth lock section (not illustrated) which is to be pressed against the Z-axis guide by the pressure of air. Specifically, air is adapted to be supplied to the Z-axis guide lock section to press the fourth lock section against the Z-axis guide by the pressure of air and to sandwich and to lock the Z-axis guide so as to fix the Z-axis guide lock section to the Z-axis guide, and to fix a Z table (not illustrated). This enables to fix the displacement of the bonding stage 1 in the direction of the arrow 27. On/off of the supply of air is controlled by an electromagnetic valve (not illustrated).

According to this embodiment, the apparatus includes the Z-axis driving mechanism, so the height of the bonding stage 1 can be controlled. Thus, various types of operations are enabled by interlocking the θ-axis rotation drive mechanism, X-axis driving mechanism, and Y-axis driving mechanism.

Moreover, a cam mechanism may be used or a combination of a motor and a lock mechanism may be used for the above-described X-axis driving mechanism, Y-axis driving mechanism, Z-axis driving mechanism, and the rotation drive mechanism.

Moreover, as described above, even if the bonding stage 1 has a plurality of driving mechanisms, the stiffness of the bonding stage 1 can be maintained and the generation of vibration can be suppressed by providing the first to fourth lock sections. As the result, the bonding stage 1 can be accurately positioned, and an increase in the bonding speed can be achieved and/or fine pitch bonding can be enabled. Moreover, because the settling time can be also reduced by providing the first to fourth lock sections, the conveying speed of the carrier tape is also increased.

Moreover, because the pressure of air is used in pressing the first lock section 23a against the θ-axis guide 22 and in pressing the second lock section 29a against the X-axis guide 28, and so on, influences on semiconductor elements and the like inside a wafer during bonding can be prevented. For example, if a magnetic force by an electromagnet etc. is used, the magnetic force may adversely affect semiconductor elements inside a wafer, but if the pressure of air is used, such adverse effect will not be caused.

An arm 11 illustrated in FIG. 1 is attached to the X table 34. This arm 11 is for hooking on a hole 31 provided in the carrier tape 8 and pulling out the carrier tape 8, and for hooking on the hole 31, pushing out and discharging the carrier tape 8. Note that this arm 11 is also referred to as a unit configured to connect a substrate to the X-axis driving mechanism.

Figure 6:
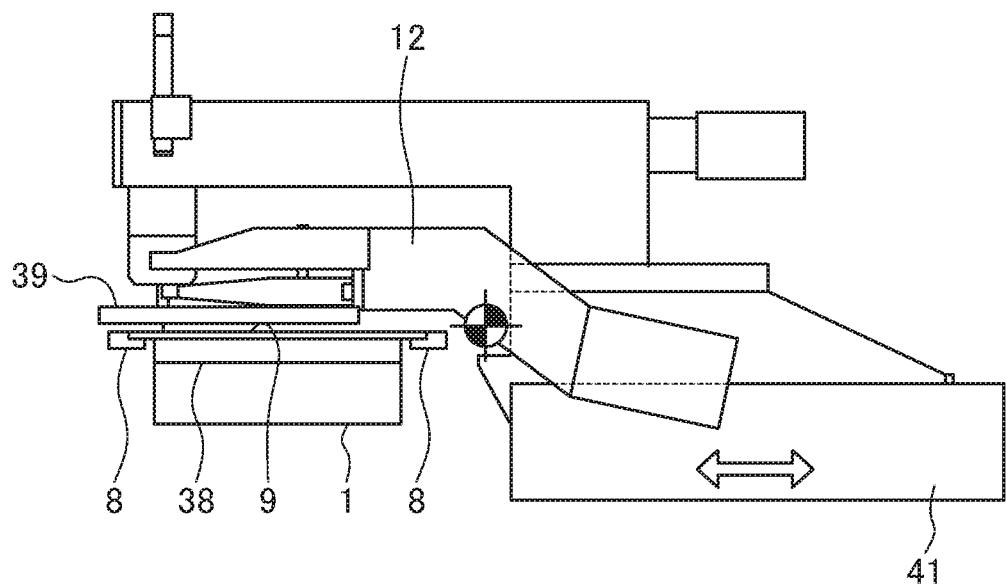
FIG. 6 is a schematic view illustrating the bonding apparatus seen in a direction of an arrow 102 illustrated in FIG. 1.

FIG. 6 is a schematic view illustrating the bonding apparatus seen in a direction of an arrow 102 illustrated in FIG. 1. A heater 38 is arranged in the bonding stage 1, and this heater 38 is for heating the wafer 9 mounted on the carrier tape 8. Moreover, the bonding apparatus includes the bonding head 12 for bonding a wire or bump onto the wafer 9 in the bonding area 4 illustrated in FIG. 1. This bonding head 12 is attached to the XY table 41 of the driving mechanism so as to be able to be displaced by the XY table 41. Moreover, a heat shield plate 39 is attached to the XY table 41, and has the role of a head cover or shutter to shield the heat of the heater 38 for the bonding head 12. The heat shield plate 39 can be displaced in the XY direction while being interlocked with the XY table 41.

Because the heat shield plate has a cooling function, the heat shield plate can reduce the temperature change of the bonding head 12 by preventing the bonding head 12 from being abnormally heated due to the heat from the heater 38 of the bonding stage 1. Thus, deterioration of the bonding positioning can be prevented.

Moreover, the bonding apparatus preferably includes a measurement device configured to measure the height of the wafer 9 held on the bonding stage 1. This measurement device may be a digital gauge or the like to measure the height of the wafer 9 or the height of the heater 38, but a Z-axis counter of the bonding head 12 is preferably used. Thus, it is possible to measure the height at which a capillary touches the wafer 9, so it is possible to measure the bonding height, correct the same, and/or issue an error in the course of bonding.

Moreover, the bonding apparatus preferably includes a control section configured to control the Z-axis driving mechanism so as to correct the height of the wafer 9 when the height of the wafer 9 needs to be corrected as the result of measuring the height of the wafer 9 with the above-described measurement device.

The reason why the height of the wafer 9 is corrected with the Z-axis driving mechanism as described above is as follows. There is a limit on completely-horizontally arranging the surface (upper surface) of the bonding stage 1, and thus the surface of the bonding stage 1 may be arranged in a state where it is slightly inclined with respect to the horizontal. In that case, if the wafer 9 held on the bonding stage 1 is rotated together with the bonding stage 1 by the rotation drive mechanism, the height of the wafer 9 may change and the bonding point may fall or rise. If in such a case, bonding is performed while recognizing the bonding position with a recognition camera without correcting the height of the wafer 9, the focus depth and the depth of field (the in-focus range) of the camera will be affected to cause a decrease in the bonding speed. In contrast, the height of the wafer 9 is measured with the above-described measurement device and the height of the wafer 9 is corrected, so that the accuracy of the bonding position by the recognition camera can be increased, and a decrease in the bonding speed can be suppressed.

Moreover, even when the wafer 9 having a different thickness is conveyed to the bonding area 4, this can be detected as abnormal and an occurrence of a work error can be also prevented in advance.

Figure 7:
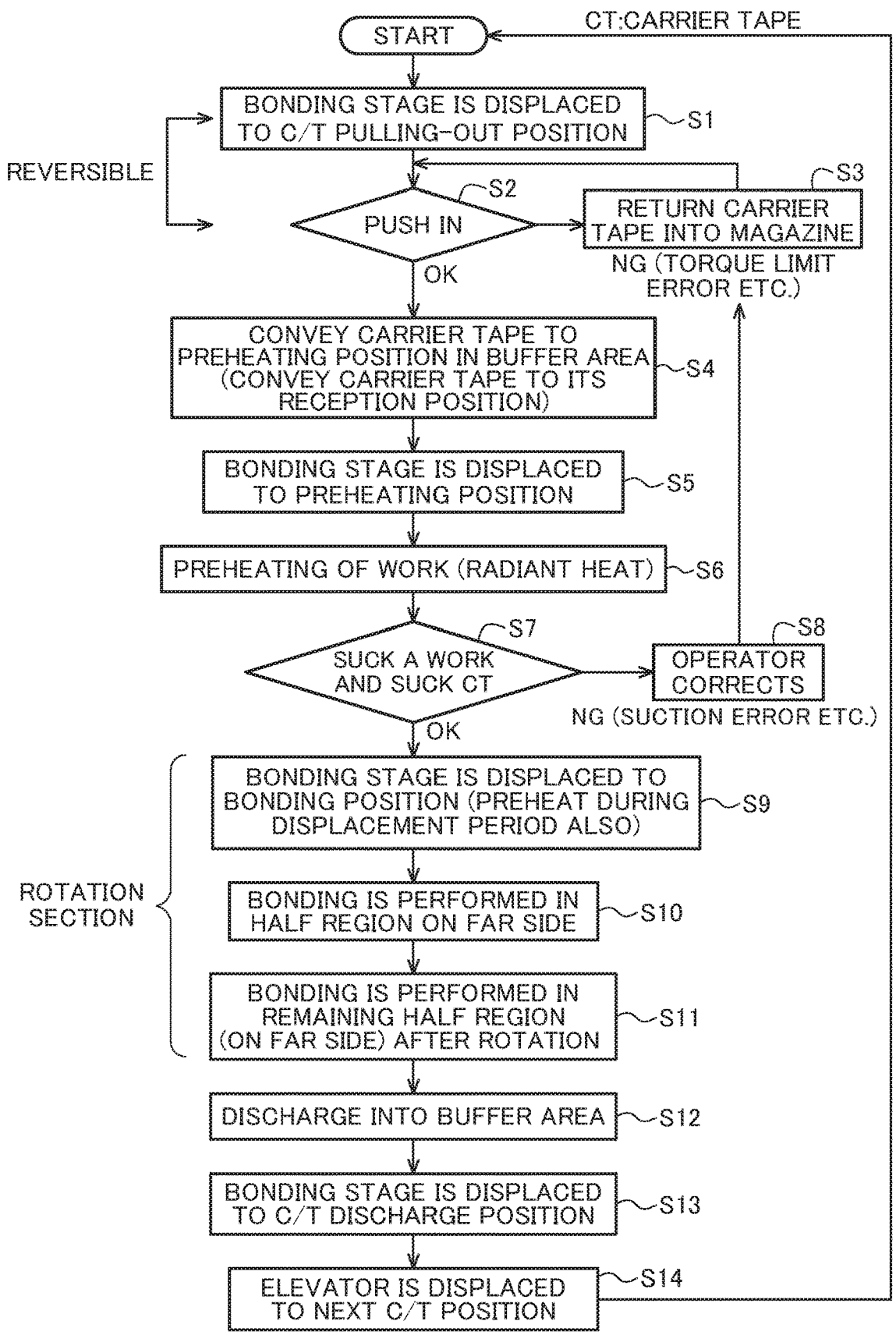
FIG. 7 is a flow chart illustrating the conveyance and the like of a wafer mounted on a carrier tape (C/T).

FIG. 7 is a flow chart illustrating the conveyance and the like of a wafer mounted on the carrier tape (C/T). FIG. 10 to FIG. 12 are the plan views for illustrating the conveying sequence of the wafers mounted on the carrier tape.

Figure 10A:
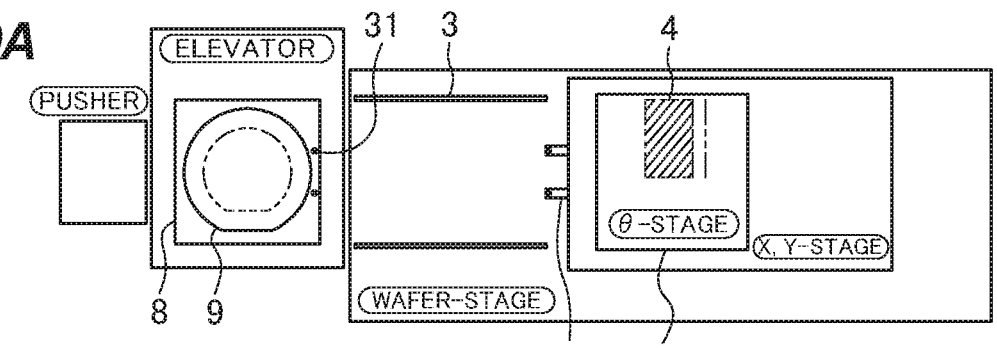
FIG. 10A to FIG. 10E are the plan views for illustrating the conveying sequence of wafers mounted on a carrier tape.
Figure 10B:
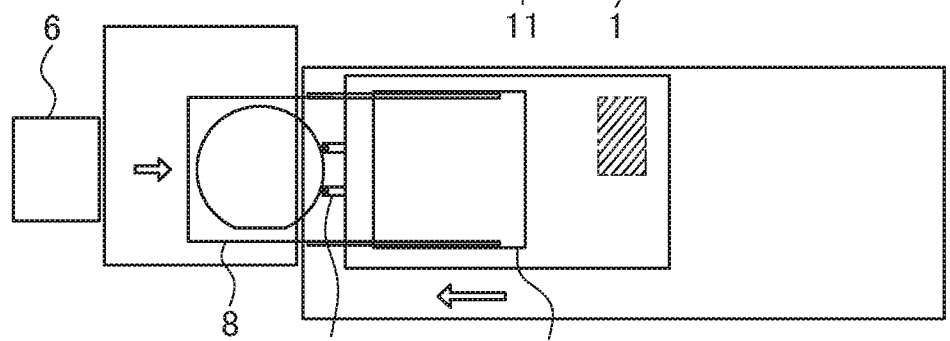

First, the carrier tape is stored into the magazine (storage section). The bonding stage 1 is located in a bonding area 4 as illustrated in FIG. 10A. Next, as illustrated in FIG. 10B, the bonding stage 1 is displaced to a C/T pulling-out position in the buffer area by the X-axis driving mechanism (S1).

Next, the carrier tape 8 inside the magazine 7 is pushed out by the pusher 6 (S2) and connected to the X-axis driving mechanism. That is, the arm 11 is hooked on the hole 31 of the carrier tape 8. Here, if the pushing-out by the pusher 6 is NG due to a torque limit error etc., then the carrier tape 8 is returned into the magazine 7 (S3). Then, the carrier tape 8 inside the magazine 7 is again pushed out by the pusher 6 (S2).

Note that, in this embodiment, the carrier tape 8 inside the magazine 7 is pushed out by the pusher 6 after the bonding stage 1 is displaced to the C/T pulling-out position, but the bonding stage 1 may be displaced to the C/T pulling-out position after the carrier tape 8 inside the magazine 7 is pushed out by the pusher 6.

Figure 10C:
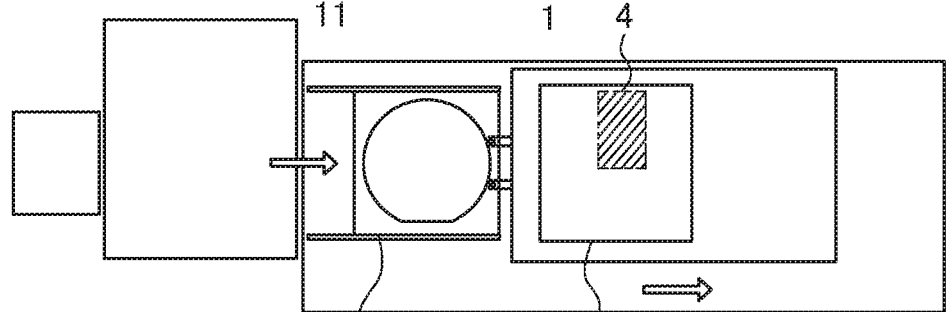

Next, as illustrated in FIG. 10C, the carrier tape 8 is pulled out from the magazine 7 to the buffer area by displacing the bonding stage 1 to the bonding area 4 with the X-axis driving mechanism. Thus, the carrier tape 8 is conveyed to a preheating position in the buffer area (S4).

Figure 10D:
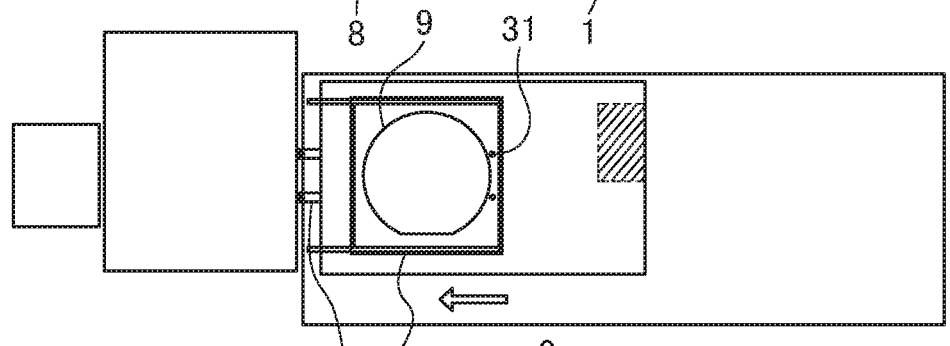

Next, as illustrated in FIG. 10D, the arm 11 is detached from the hole 31 of the carrier tape 8 by displacing the bonding stage 1 downward (downward in the Z-axis) with the Z-axis driving mechanism, and the bonding stage 1 is displaced to the buffer area by the X-axis driving mechanism (S5), and then preheating of the wafer 9 is started with the heater 38 illustrated in FIG. 6 (S6). Then, the wafer 9 mounted on the carrier tape 8 is sucked with vacuum to the bonding stage 1 (S7). Here, if suction error occurs, an operator returns the wafer 9 into the magazine 7 (S8). Note that, in order to start preheating the wafer 9 before sucking the wafer 9 to the bonding stage 1, preheating of the wafer 9 utilizing the radiant heat corresponding to the height of the heater is preferably programmed.

Figure 10E:
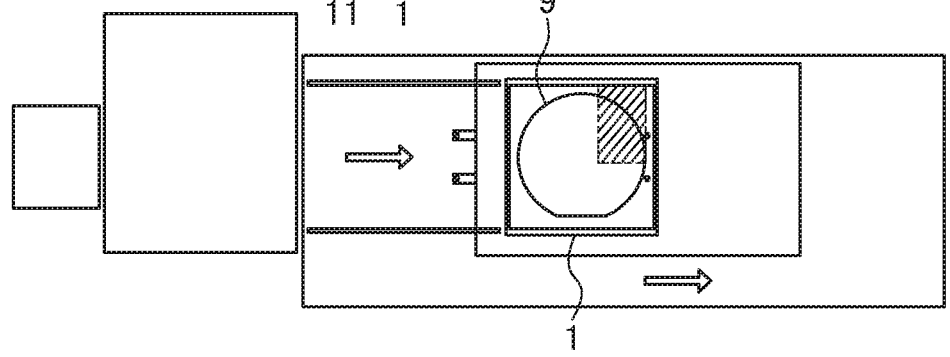

Next, as illustrated in FIG. 10E, the bonding stage 1 is displaced to the bonding area by the X-axis driving mechanism (S9). Also during this displacing period, preheating is applied to the wafer 9. If the wafer 9 is abruptly heated immediately before the bonding process, the wafer 9 may be damaged or thermally deformed, but the damage or thermal deformation of the wafer 9 can be suppressed by applying preheating in this manner. Note that, the θ-axis guide 22, X-axis guide 28, Y-axis guide 32, and Z-axis guide are preferably locked in advance by the θ-axis guide lock section 23, X-axis guide lock section 29, and Y-axis guide lock section 33, respectively, in displacing the bonding stage 1.

As described above, the bonding stage 1 is displaced downward by the Z-axis driving mechanism, the bonding stage 1 is displaced to the buffer area by the X-axis driving mechanism, the carrier tape 8 is held on the bonding stage 1, and the bonding stage 1 is displaced to the bonding area by the X-axis driving mechanism, so the movement amount of the bonding stage 1 can be reduced.

Figure 11A:
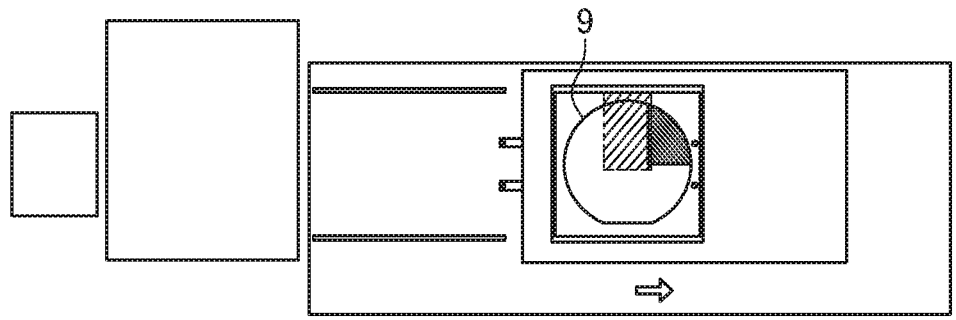
FIG. 11A to FIG. 11E are the plan views for illustrating the conveying sequence of wafers mounted on a carrier tape.
Figure 11B:
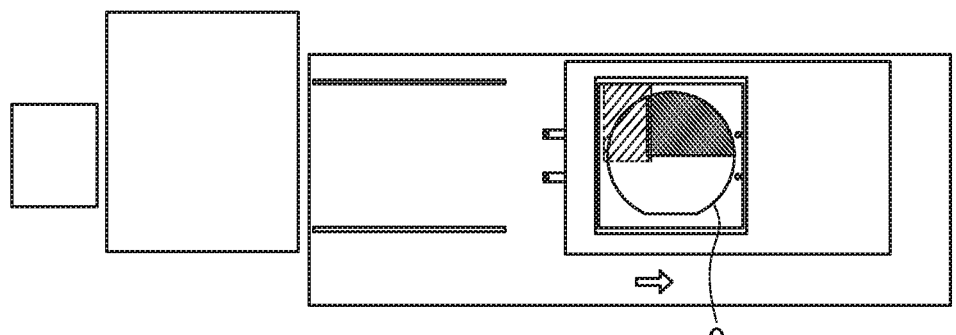

Next, as illustrated in FIG. 10E, FIGS. 11A and 11B, a wire or bump is bonded onto a half region on the far side of the wafer 9 (S10). Here, bonding is performed in three stages in the order from a right one-third region on the far side of the wafer 9 illustrated in FIG. 10E, to a center one-third region on the far side of the wafer 9 illustrated in FIG. 11A, and to a left one-third region on the far side of the wafer 9 illustrated in FIG. 11B, but depending on the size of the wafer 9, bonding may be performed once or in two stages.

Figure 11C:
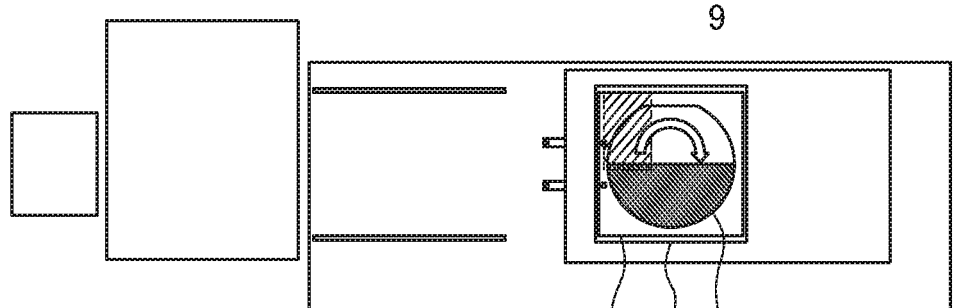
Figure 11D:
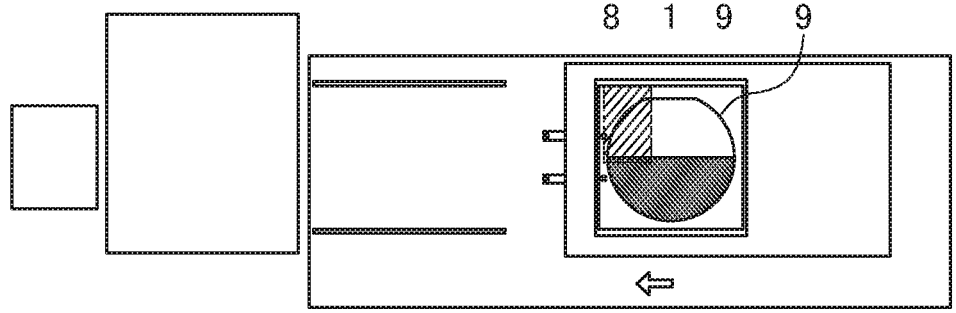
Figure 11E:
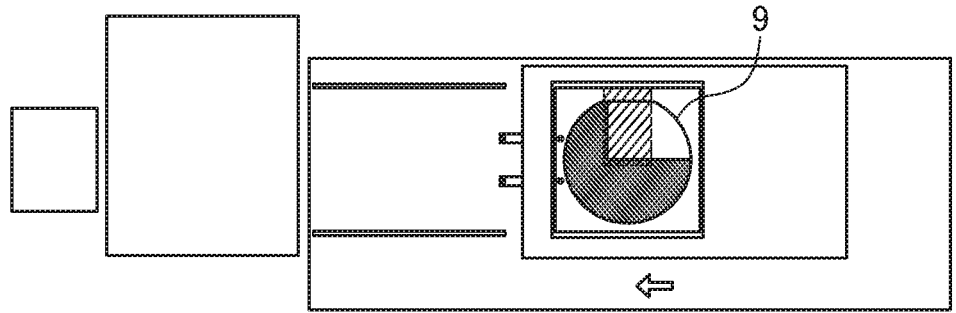
Figure 12A:
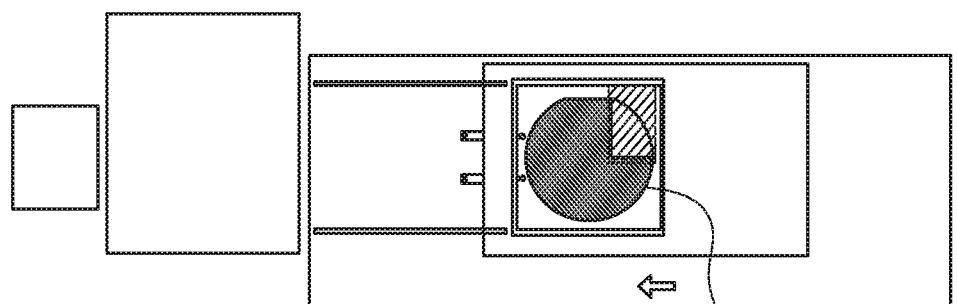
FIG. 12A to FIG. 12E are the plan views for illustrating the conveying sequence of wafers mounted on a carrier tape.

Next, as illustrated in FIG. 11C, the carrier tape 8 is rotated by 180° by rotating the bonding stage 1 by 180° with the rotation drive mechanism, and then as illustrated in FIGS. 11D, 11E, and FIG. 12A, a wire or bump is bonded onto the remaining half region of the wafer 9 (S11). Note that the details of bonding will be described later.

Figure 12B:
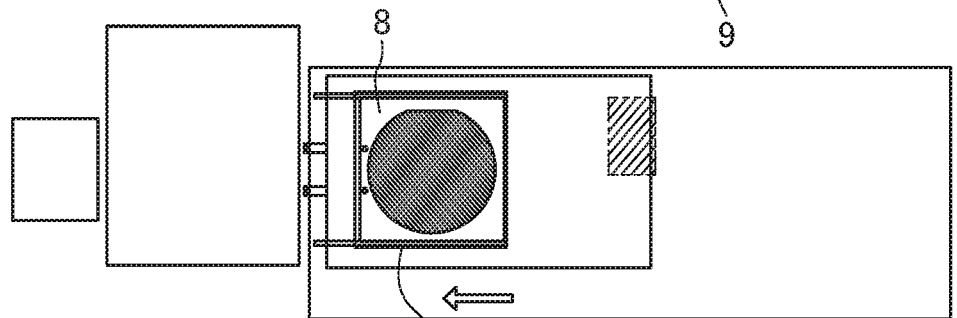
Figure 12C:
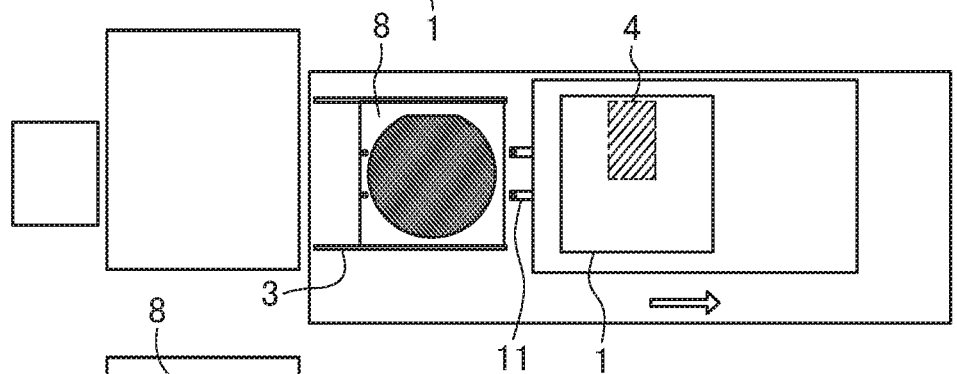
Figure 12D:
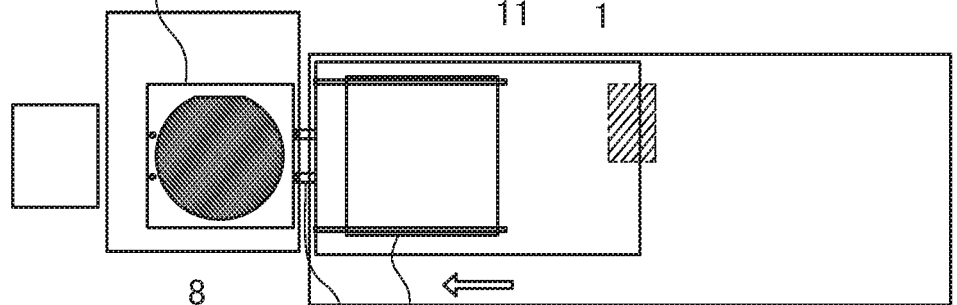

Next, as illustrated in FIG. 12B, the bonding stage 1 is displaced to a C/T discharge position in the buffer area by the X-axis driving mechanism (S12). Next, as illustrated in FIG. 12C, the carrier tape 8 is placed on the buffer unit 3 in the buffer area, the bonding stage 1 is displaced to the bonding area 4 by the X-axis driving mechanism, and the arm 11 is displaced to a discharge start position of the carrier tape 8 (S13). Next, as illustrated in FIG. 12D, the bonding stage 1 is displaced to the buffer area, so that the carrier tape 8 is pushed out and stored into the magazine 7 by the arm 11.

Figure 12E:
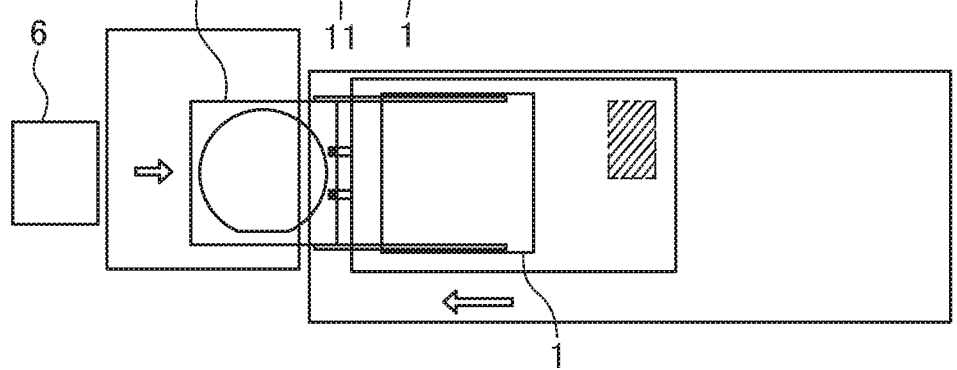

Next, a carrier tape to be subjected to bonding process next is displaced inside the magazine 7 by the elevator 5 illustrated in FIG. 1 (S14). Then, as illustrated in FIG. 12E, the bonding stage 1 is displaced to the C/T pulling-out position in the buffer area by the X-axis driving mechanism, and then the carrier tape 8 inside the magazine 7 is pushed out by the pusher 6 and connected to the X-axis driving mechanism.

Figure 8:
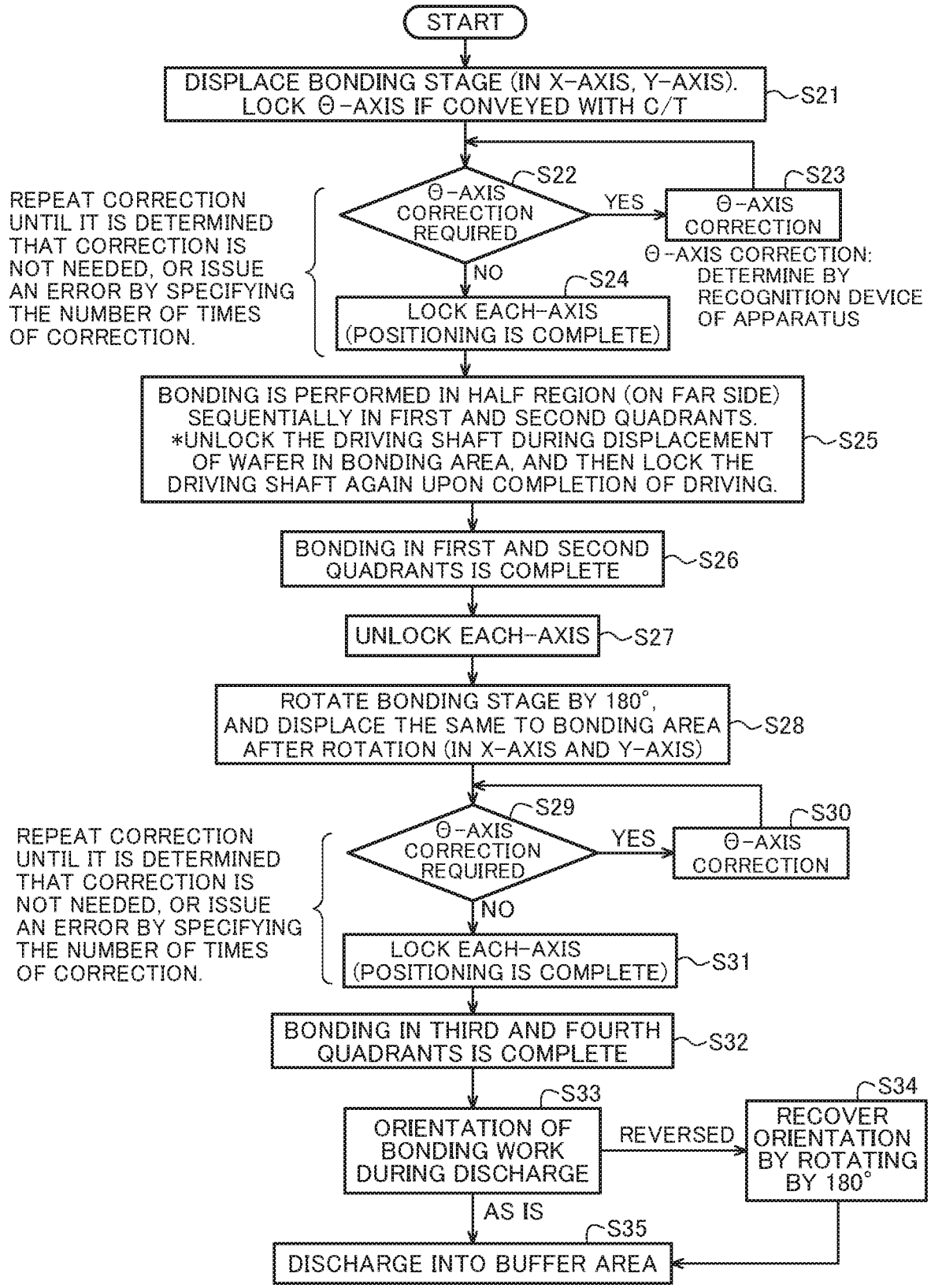
FIG. 8 is a flow chart of a rotation section illustrated in FIG. 7.

FIG. 8 is the flowchart of a rotation section illustrated in FIG. 7.

As illustrated in FIG. 10E, the bonding stage 1 is displaced to the bonding area by the X-axis driving mechanism (S21, S9 of FIG. 7). Note that, the bonding apparatus includes: a recognition device (for example, image pickup device) configured to recognize the position of the wafer 9 held on the bonding stage 1; and a control section (not illustrated) configured to control, if the position of the θ-axis of the wafer 9 needs to be corrected as a result of recognizing the position of the wafer 9 with this recognition device, the rotation drive mechanism so as to correct the position of the θ-axis of the wafer 9.

Next, the position of the wafer 9 is recognized with the recognition device, and if the position of the θ-axis of the wafer 9 needs to be corrected, the position of the θ-axis of the wafer 9 is corrected with the rotation drive mechanism (S22, S23). Next, the position of the wafer 9 is recognized again with the recognition device, and it is determined whether or not the position of the θ-axis of the wafer 9 needs to be corrected. If it is determined that the correction is needed, the position of the θ-axis of the wafer 9 is corrected again. The correction may be repeated until it is determined that the correction is not needed, or the number of times of correction may be specified in advance and if this specified number of times of correction is exceeded, then an error may be issued.

If it is determined that the correction is not needed, the θ-axis guide 22 is locked by the θ-axis guide lock section 23. Moreover, the X-axis guide 28 is locked by the X-axis guide lock section 29, the Y-axis guide 32 is locked by the Y-axis guide lock section 33, and the Z-axis guide is locked by the Z-axis guide lock section. Thus, the positioning of the wafer 9 is completed (S24).

Next, as illustrated in FIG. 10E, FIGS. 11A and 11B, a wire or bump is bonded in the half region on the far side (in the first and second quadrants) of the wafer 9 (S25). The driving shaft is unlocked during displacement of the wafer, and is locked again upon completion of driving.

Next, as illustrated in FIG. 11B, bonding on the far side of the wafer 9 is completed (S26), and subsequently each-axis is unlocked (S27). Next, as illustrated in FIG. 11C, the carrier tape 8 is rotated by 180° by rotating the bonding stages 1 by 180° with the rotation drive mechanism (S28).

Next, the position of the wafer 9 is recognized with the recognition device, and if the position of the θ-axis of the wafer 9 needs to be corrected, the position of the θ-axis of the wafer 9 is corrected with the rotation drive mechanism (S29, S30). Next, the position of the wafer 9 is recognized again with the recognition device, and it is determined whether or not the position of the θ-axis of the wafer 9 needs to be corrected. If it is determined that the correction is needed, the position of the θ-axis of the wafer 9 is corrected again. The correction may be repeated until it is determined that the correction is not needed, or the number of times of correction may be specified in advance and if this specified number of times of correction is exceeded, then an error may be issued.

If it is determined that the correction is not needed, the θ-axis guide 22 is locked by the θ-axis guide lock section 23. Moreover, the X-axis guide 28 is locked by the X-axis guide lock section 29, the Y-axis guide 32 is locked by the Y-axis guide lock section 33, and the Z-axis guide is locked by the Z-axis guide lock section. Thus, the positioning of the wafer 9 is completed (S31).

Next, as illustrated in FIGS. 11D, 11E, and FIG. 12A, a wire or bump is bonded in the remaining half region (in the third and fourth quadrants) of the wafer 9 (S32).

Next, as illustrated in FIG. 12B, the bonding stage 1 may be displaced to the C/T discharge position of the buffer area by the X-axis driving mechanism without changing the orientation of the carrier tape 8 (S33, S35). However, the orientation of the carrier tape 8 may be returned to the orientation illustrated in FIG. 10A by rotating the bonding stage 1 by 180° with the rotation drive mechanism, and then the bonding stage 1 may be displaced to the C/T discharge position in the buffer area with the X-axis driving mechanism (S34, S35).

FIG. 9 is a flow chart illustrating the details of the method for measuring the height of a wafer performed in the step illustrated in FIG. 10E and in the step illustrated in FIG. 11C.

As illustrated in FIG. 10E, after displacing the bonding stage 1 to the bonding area by the X-axis driving mechanism, the height of the wafer 9 is measured with the measurement device. That is, a height at which the capillary touches the wafer 9 is measured with the Z-axis counter of the bonding head to measure the distance between the origin of the Z-axis and the touch point (S41). As the result, if the height of the wafer 9 needs to be corrected, the height of the wafer 9 is corrected with the Z-axis driving mechanism (S42, S43).

Next, the height of the wafer 9 is measured again with the measurement device, and it is determined whether or not the height of the wafer 9 needs to be corrected. If it is determined that the correction is needed, the height of the wafer 9 is corrected again. The correction may be repeated until it is determined that the correction is not needed, or the number of times of correction may be specified in advance and if this specified number of times of correction is exceeded, then an error may be issued.

If it is determined that the correction is not needed, the Z-axis guide is locked by the Z-axis guide lock. Thus, the height of the wafer 9 has been determined. Next, a wire or bump is bonded in the half region on the far side (in the first and second quadrants) of the wafer 9 (S44).

Also in the step illustrated in FIG. 11C, the height correction and the like of the wafer 9 are performed in a manner similar to the above-described one.

Moreover, the height correction and the like of the wafer 9 may be performed in a manner similar to the above-described one for each of the first to fourth quadrants where bonding is performed. Thus, a change in height due to the warp of a wafer can be more strictly adjusted to enable higher-quality bonding.

Moreover, even if the bonding height of the wafer 9 changes after rotating the carrier tape 8 by 180° with the rotation drive mechanism, this change can be addressed and high-quality bonding is possible.

Figure 13:
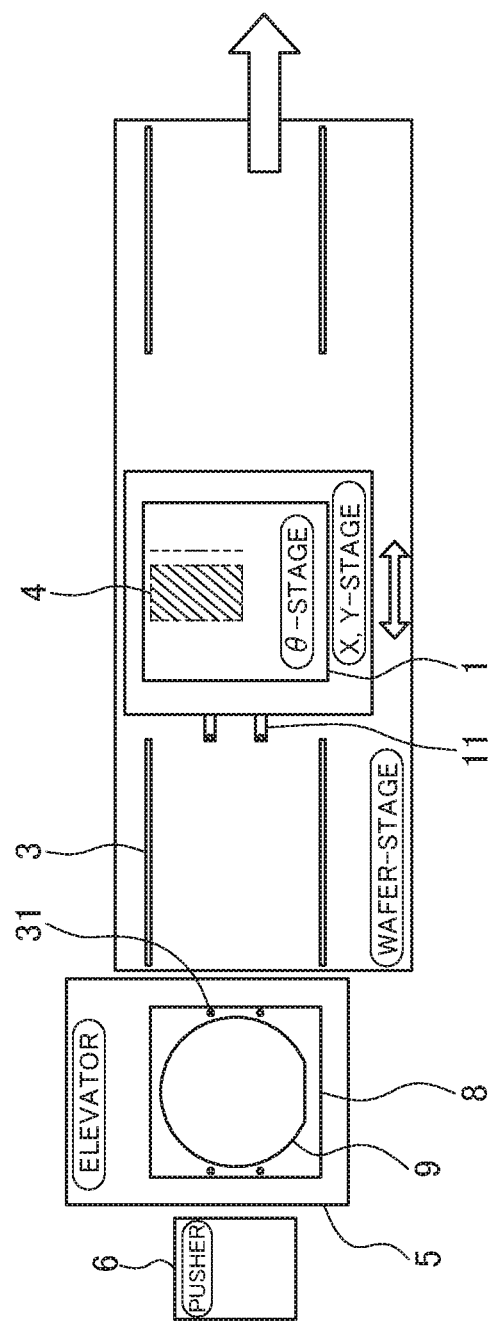
FIG. 13 is a plan view schematically illustrating a bonding apparatus according to another aspect of the present invention.

FIG. 13 is a plan view schematically illustrating a bonding apparatus according to another aspect of the present invention, in which an element identical to the one in FIG. 1 is marked with an identical reference sign. This bonding apparatus has, a buffer unit of a buffer area, a magazine, and an elevator arranged on the right side of the bonding apparatus illustrated in FIG. 1 (not illustrated). Thus, the carrier tape 8 having the wafer 9 after completion of bonding mounted thereon can be discharged to the right side.

According to this embodiment, the bonding area can be expanded as much as possible by combining the apparatus having an expanded bonding area with the bonding stage having the X-axis driving mechanism, Y-axis driving mechanism, Z-axis driving mechanism, and θ-rotation-axis driving mechanism, and the adaptability to the types of products can be increased.

Moreover, in this embodiment, the following effects are expected by providing the lock mechanism for each-axis:
 a reduction in size of a drive source (cost reduction)
 an increase in positioning accuracy (increase in productivity)
 a reduction in settling time for each-axis (increase in productivity)

Moreover, in this embodiment, the following effects are expected by providing the θ-axis rotation drive mechanism.
 preheating is required only once and the output of products, such as wafers, subject to breakage can be increased (increase in productivity).
 preheating is required only once and the productivity is increased (increase in productivity).
 the separately-placed inversion unit is not necessary (reduction in space, reduction in cost).

Moreover, in this embodiment, the following effect is expected by providing the Z-axis driving mechanism.
 the exchange of the heater (plate) due to a difference in the thickness of a wafer is not necessary (improvement in adaptability to the types of products).

Moreover, in this embodiment, the following effect is expected by attaching a heat shield plate (cover/shutter) to the bonding head.
 deterioration of the bonding positioning can be prevented because the temperature change of the bonding head can be reduced Accordingly, the productivity (output) can be improved as a whole because a bonding work in a wide area of a 6-inch wafer or the like, which the conventional bonding apparatus cannot respond to, can be efficiently bonded.

EXPLANATION OF SYMBOLS 1 bonding stage
3 buffer unit
4 bonding area
5 elevator (vertically driving mechanism)
6 pusher
7 magazine
8 carrier tape
9 wafer
9a orientation flat
10 rotation stopper
11 arm
12 bonding head
θ-axis (θ rotation-axis)
θ-axis guide
θ-axis guide lock section
23a first lock section
24, 25, 26 and 27 arrow
28 X-axis guide
29 X-axis guide lock section
29a second lock section
31 hole
32 Y-axis guide
33 Y-axis guide lock section
33a third lock section
34 X table
35 Y table
38 heater
39 heat shield plate
41 XY table
42 and 43 arrow
44 and 45 electromagnetic valve
46 and 47 air

The invention claimed is:

1. A bonding method using a bonding apparatus including a rotation drive mechanism for rotating a bonding stage about a θ-axis, the method comprising the steps of:
    (e) locking said bonding stage with respect to said θ-axis, and bonding a wire or bump onto a certain area of a substrate held on said bonding stage;
    (f) unlocking the bonding stage with respect to said θ-axis, and rotating said bonding stage about said θ-axis with said rotation drive mechanism; and
    (g) locking said bonding stage with respect to said θ-axis, and bonding a wire or bump onto a remaining region of said substrate.

2. The bonding method according to claim 1, wherein said substrate is a wafer mounted on a carrier tape, wherein said carrier tape includes a rotation stopper for positioning the wafer with an orientation flat or a notch, and wherein said bonding apparatus includes an X-axis driving mechanism for displacing said bonding stage along an X-axis guide, the method further comprising the steps of: prior to said step (e),
    (a) storing said carrier tape into a storage section,
    (b) connecting said carrier tape to said X-axis driving mechanism, and conveying said carrier tape to a buffer area with said X-axis driving mechanism,
    (c) displacing said bonding stage to said buffer area with said X-axis driving mechanism and holding said carrier tape on said bonding stage, and
    (d) displacing said bonding stage to a bonding area with said X-axis driving mechanism, wherein said step (e) is a step of locking said bonding stage with respect to said θ-axis and said X-axis guide and bonding a wire or bump onto a certain area of said wafer of said carrier tape held on said bonding stage, and said step (g) is a step of locking said bonding stage with respect to said θ-axis and said X-axis guide and bonding a wire or bump onto a remaining region of said wafer.

3. The bonding method according to claim 2, wherein
    said bonding apparatus includes a Z-axis driving mechanism for displacing said bonding stage along a Z-axis guide, and wherein
    said step (c) is a step of detaching said carrier tape from said X-axis driving mechanism by displacing the bonding stage downward with said Z-axis driving mechanism, displacing said bonding stage to said buffer area with said X-axis driving mechanism and holding said carrier tape on said bonding stage.

4. The bonding method according to claim 2, wherein said bonding apparatus includes a heater for heating said bonding stage, and wherein said step (c) is a step of displacing said bonding stage to said buffer area with said X-axis driving mechanism, applying preheating to said wafer, and holding said carrier tape on said bonding stage.

5. The bonding method according to claim 2, wherein said bonding apparatus includes a recognition device configured to recognize a position of said wafer held on said bonding stage, and wherein said step (d) is a step of displacing said bonding stage to a bonding area with said X-axis driving mechanism, and correcting, if a position of said θ-axis of said wafer needs to be corrected as a result of recognizing the position of said wafer with said recognition device, a position of said θ-axis of said wafer with said rotation drive mechanism.

6. The bonding method according to claim 2, wherein said bonding apparatus includes a measurement device configured to measure a height of said wafer held on said bonding stage, and wherein said step (d) is a step of displacing said bonding stage to a bonding area with said X-axis driving mechanism, and correcting, if the height of said wafer needs to be corrected as a result of measuring a height of said wafer with said measurement device, a height of said wafer with said Z-axis driving mechanism.

* * * * *